AUTOMATIC TUNING TYPE RECEIVER WITH FREQUENCY HOLDING CIRCUIT

Filed July 5, 1968 5 Sheets-Sheet 1

United States Patent Office 3,560,858

Patented Feb. 2, 1971

3,560,858

AUTOMATIC TUNING TYPE RECEIVER WITH FREQUENCY HOLDING CIRCUIT

Yasuhide Sakai, Kawasaki-shi, and Yoshinori Takagi and Masahiro Watanabe, Yokohama, Japan, assignors to Matsushita Electric Industrial Co., Ltd., Osaka, Japan, a corporation of Japan Filed July 5, 1968, Ser. No. 742,673

Claims priority, application Japan, July 11, 1967, 42/45,171; July 14, 1967, 42/46,000; July 24, 1967, 42/48,046; Dec. 15, 1967, 42/81,347; Apr. 9, 1968, 43/24,178

Int. Cl. H04b *1/32*

U.S. Cl. 325—470 7 Claims

ABSTRACT OF THE DISCLOSURE

An automatic tuning type receiver using variable reactance elements of which the reactance value is electronically varied in accordance with a voltage or current supplied thereto, thereby making it possible to positively effect the frequency sweep and sustain the tuned state.

This invention relates to an automatic tuning type receiver using electronic variable reactance elements such as voltage-controlled variable capacitance element, current controlled variable inductance element or the like in the tuning circuit thereof, thereby making it possible to positively and effectively lock the received frequency when the received signal becomes extinct, and effect the tuning and sweeping operations.

With a receiver using electronic variable reactance elements, for example, in case the received radio wave is interrupted due to some causes, the tuned state should be maintained until the wave is recovered. Otherwise, the possibility tends to occur that sweeping is effected to seek other radio wave at the time when the recovery occurs.

Accordingly, it is a primary object of this invention to provide an automatic tuning type receiver which is capable of locking the received frequency until the received radio wave is recovered, in case the radio wave is interrupted.

Another object of this invention is to provide an automatic tuning type receiver in which during the sweeping operation, the sweeping is ceased when an accurate tuning point is reached, so that noiseless reception can be achieved.

Still another object of this invention is to provide an automatic tuning type receiver in which the sweeping operation can easily be performed, and bi-directional sweeping is possible.

Figure 1:
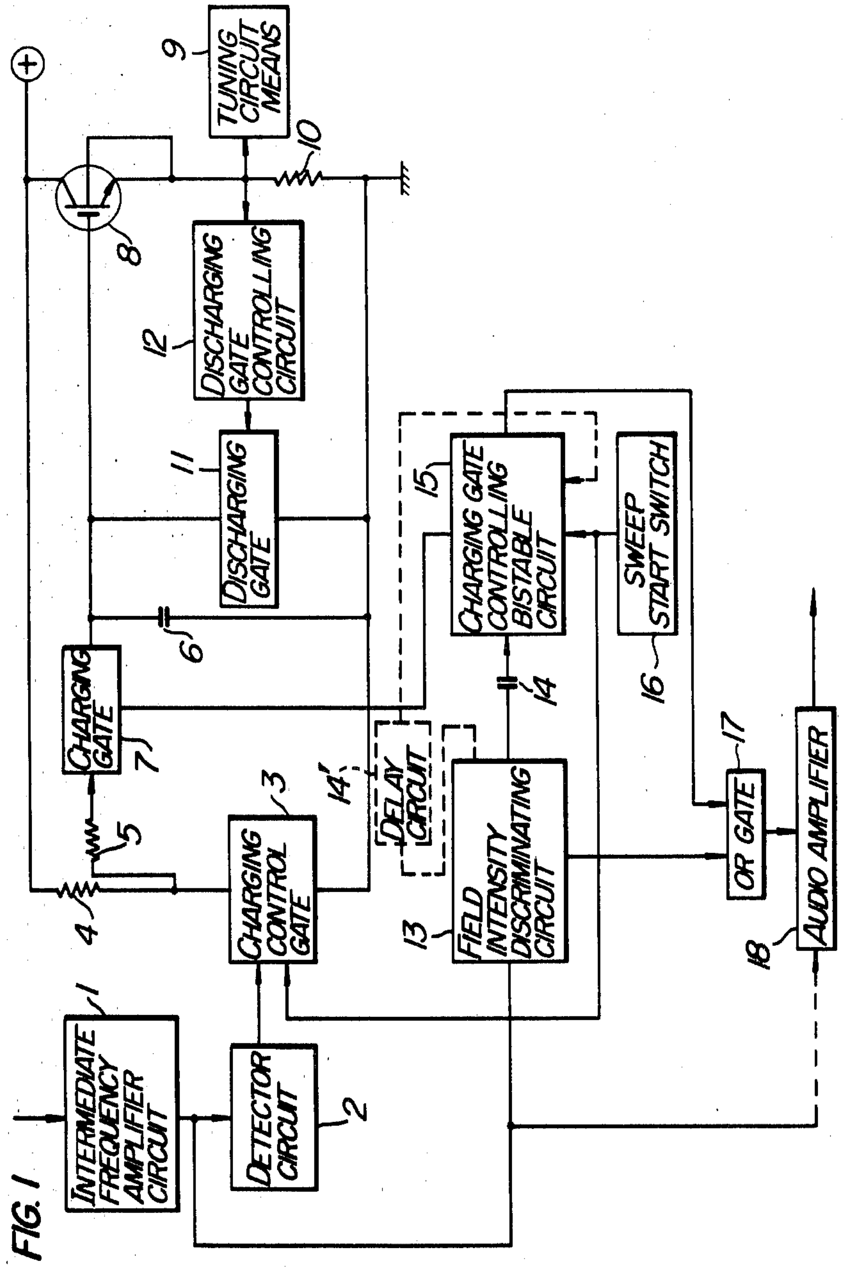
Figure 2:
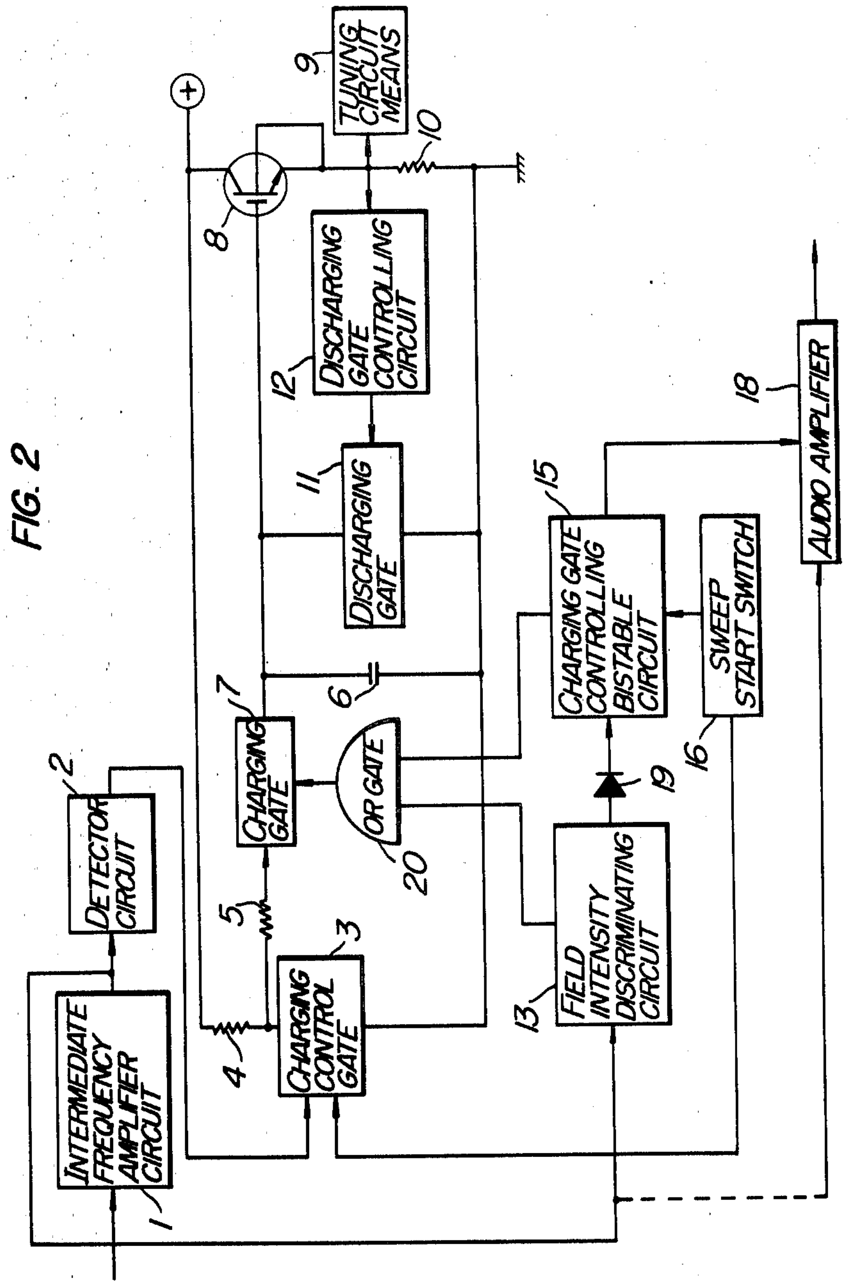
Figure 3:
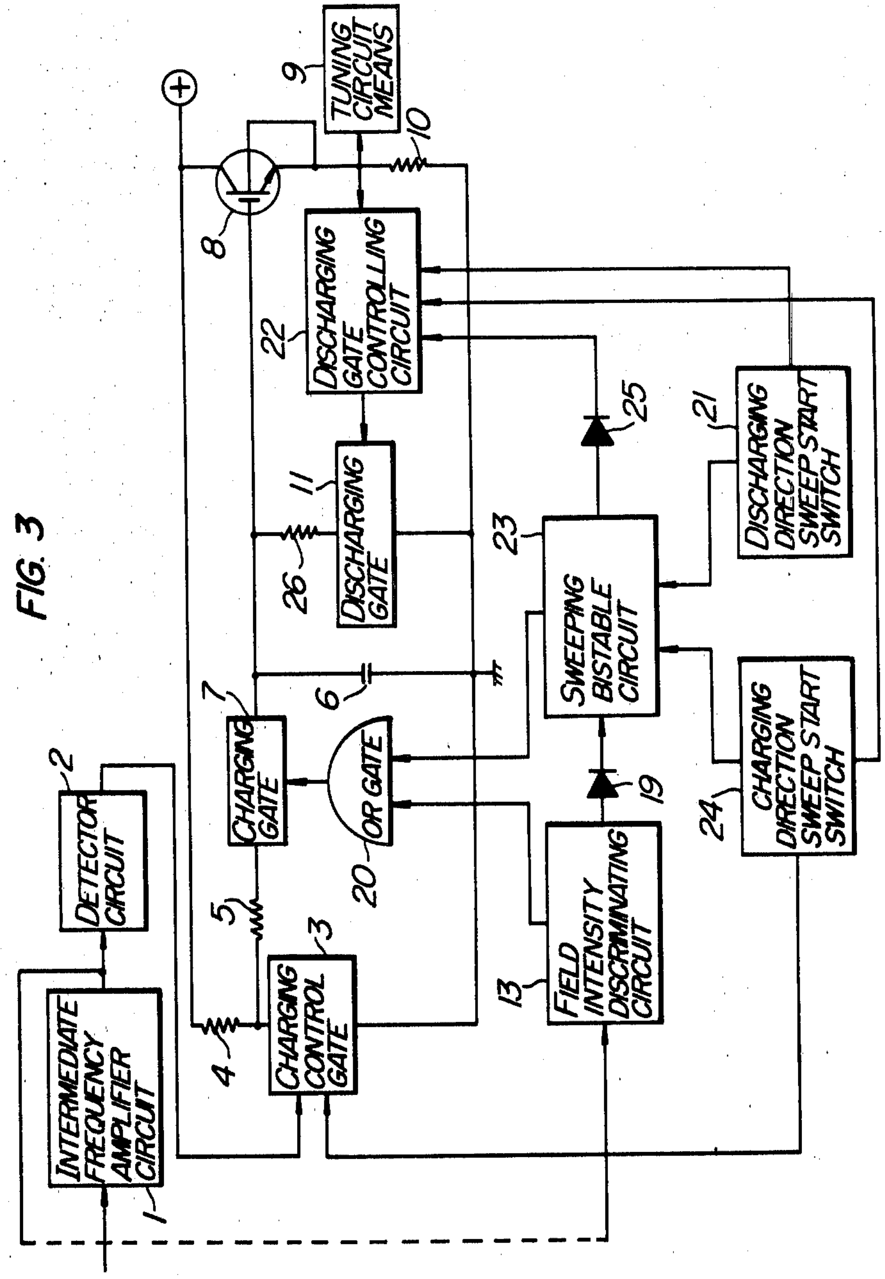
Figure 4:
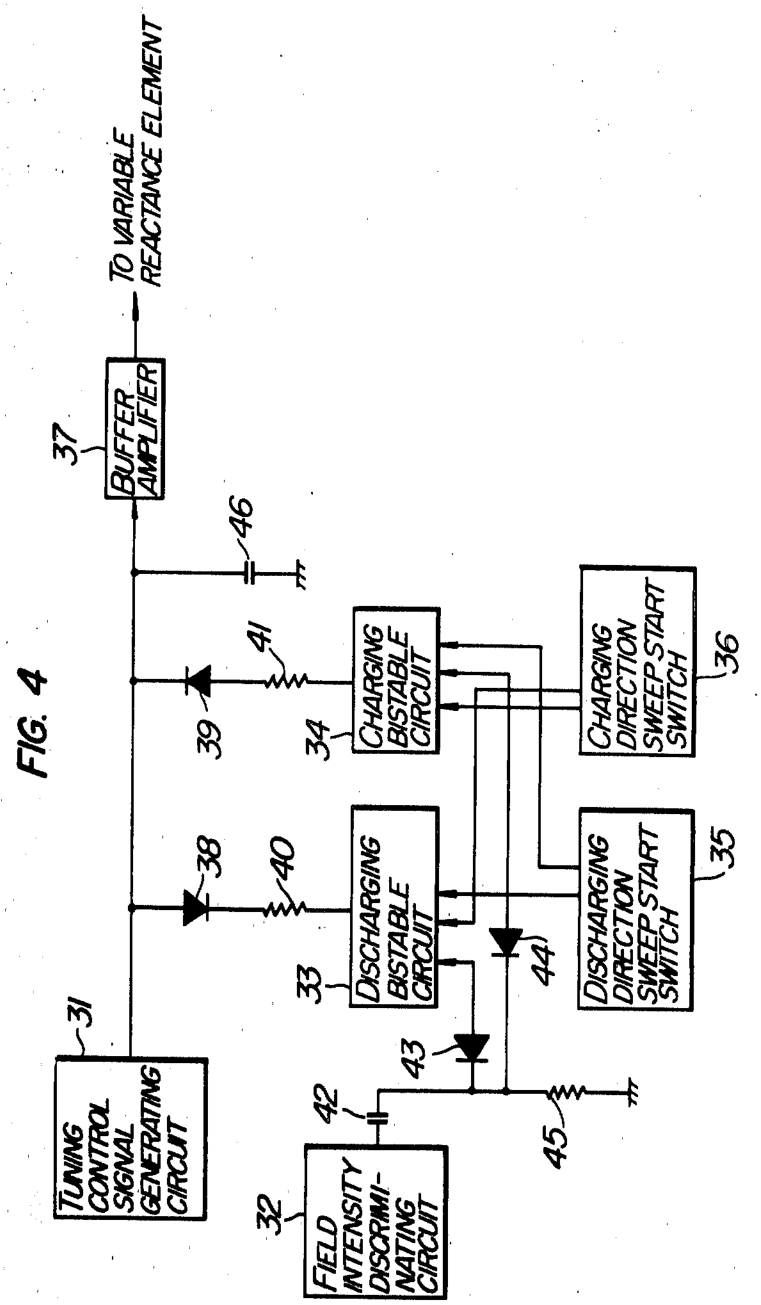
Figure 5:
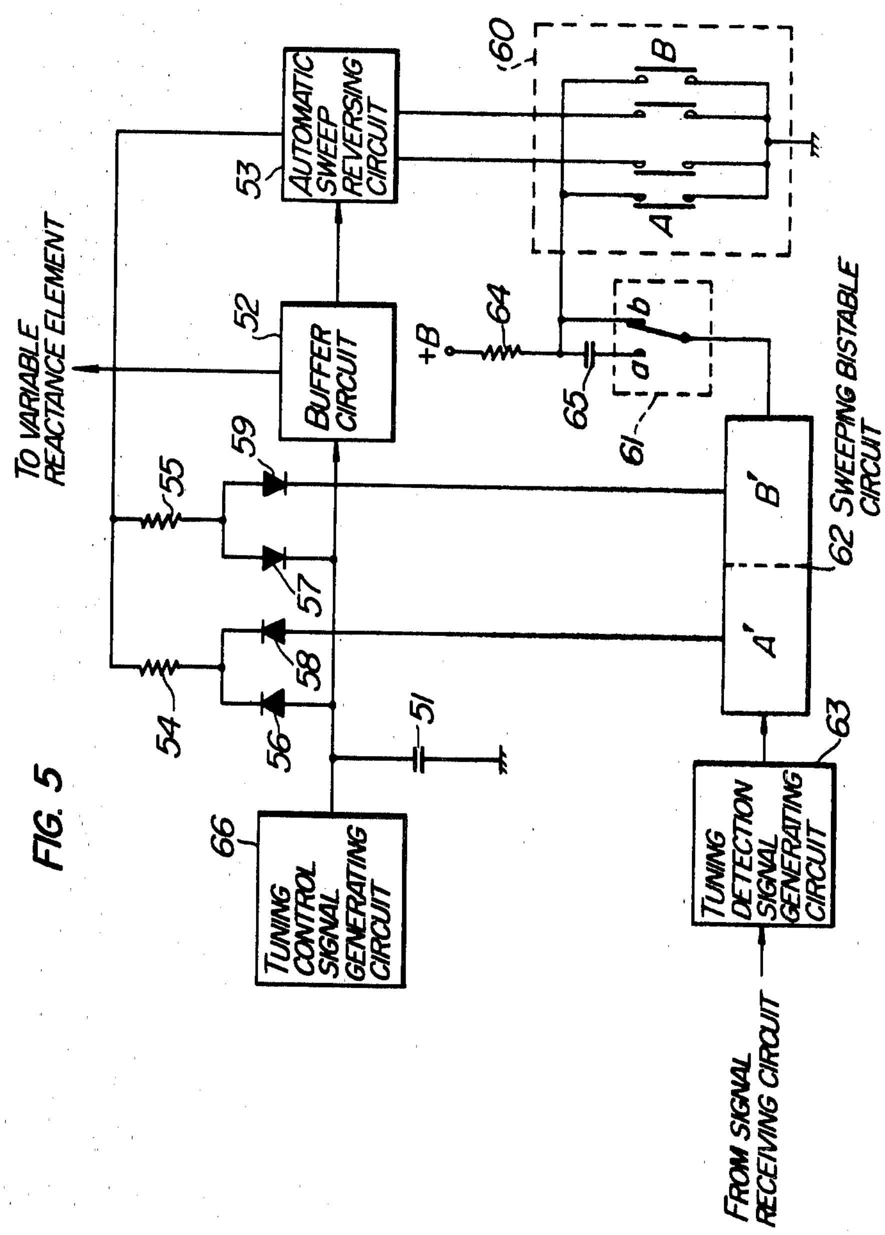

Other objects, features and advantages of this invention will become apparent from the following description when taken in conjunction with the accompanying drawings, in which:

FIGS. 1 and 2 are circuit diagrams showing the automatic tuning portions for the case of uni-directional sweeping; and FIGS. 3 to 5 are circuit diagrams showing the automatic tuning portions for the case of bi-directional sweeping.

An embodiment of the present invention will be described with reference to FIG. 1, wherein the reference numeral 1 represents an intermediate frequency amplifier circuit, 2 a detector circuit for detecting or narrow band-detecting the output of the amplifier circuit 1, 3 a charge controlling gate for effecting the charge control in accordance with the detected output under the control of a sweep start switch which will be described later, 4 a load resistor of the charge controlling gate 3, 5 a resistor constituting together with a capacitor 6 an integrating circuit the terminal voltage of which determines the tuned frequency, 7 a charging gate, 8 a buffer amplifier constituted by an MOS type field effect transistor with a very high input imepdance, and 9 a tuning circuit means comprising an antenna, a radio frequency tuning circuit, a local oscillator circuit and so forth. The tuning circuit means 9 includes variable reactance elements of which the reactance value is controlled in accordance with a voltage or current imparted to the buffer amplifier 8. The reference numeral 10 denotes a load resistor, 11 a discharging gate connected in parallel with the capacitor 6, and 12 a discharging gate controlling circuit for opening the discharging gate 11 when the charged voltage of the capacitor 6 assumes a predetermined value, thereby decreasing the charge at the capacitor 6 down to a predetermined value. The circuit 12 is constituted by an unbalance type Schmitt circuit. The reference numeral 13 represents a field intensity discriminating circuit adapted for reversibly operating between two different states in accordance with the intensity of an input field such as narrow-band detection output, AGC output or the like, 14 a coupling capacitor, and 15 a charging gate controlling bistable circuit which is supplied with an input obtained by differentiating the output of the field intensity discriminating circuit 13 through the coupling capacitor 14 and which is so designed as to repeat reversal operation in synchronism with the reversal operation of the field intensity discriminating circuit 13 and render the charging gate 7 open only when the received field is strong, thereby making it possible to control the charge. Furthermore, the charging gate controlling bistable circuit 15 is also designed to render the charging gate 7 open in accordance with the instruction by the sweep start switch 16 thus making it possible to effect the frequency sweep. The reference numeral 17 indicates an OR gate, and 18 an audio amplifier which is controlled by the output of the OR gate 17 so that it is rendered operative in the presence of the output of the OR gate 17.

Description will now be made of the operation of this device. The charging control gate 3 is supplied with an input signal which is obtained by detecting a signal of which the intensity varies in accordance with the intensity of an electric field received by the receiver. Thus, when the received field goes strong, the gate 3 is opened to cause the load resistor 4 to be grounded therethrough so that the charging of the capacitor 6 through the lead resistor 4, integrating resistor 5 and charging gate 7 is prevented. In case the intensity of the received field is low, on the other hand, the gate 3 is closed so that the charging path for capacitor 6 is established. The discharging gate 11 remains closed during the reception controlling and sweeping operations. Thus, a tuning reference voltage is developed across the capacitor 6, and it is applied to the variable reactance elements of the tuning circuit means 9 through the buffer amplifier 8, so that the received frequency is swept.

When a broadcast radio wave is tuned by a sweeping operation, the field intensity discriminating circuit 13 drives the charging gate controlling bistable circuit 15 in such a direction as to render the charging gate 7 open since the intensity of the received field is sufficiently high, but the charging gate controlling bistable circuit 15 is not reversed at this time since it has already been reversed in such a direction as to open the charging gate 7 by means of the sweep start switch 16 which operates upon initiation of the sweeping operation. If the field intensity discriminating circuit 13 is reversely switched to a state corresponding to a low field intensity due to attenuation or extinction of the received field after the receiving state has once been entered, then the charging gate controlling bistable circuit 15 is simultaneously reversed and the charging gate 7 is closed so that the voltage across the capacitor 6 is maintained constant. Thus, the frequency can be locked. In this way, the sweep can be repeated until an input field with a level in excess of a predetermined value is received, and once the receiving state has been entered, the frequency is locked irrespective of extinction of the input field.

In order to prevent excessive noise from occurring in the audio amplifier circuit 18 of the receiver during the sweeping operation, the audio amplifier circuit 18 is maintained in the non-operative state only during the sweeping operation and it is returned to the initial or operative state upon completion of tuning operation. To this end, design is made such that the audio amplifier circuit is controlled by a signal source which is provided by the "OR" output resulting from the output of the aforementioned field intensity discriminating circuit 13 and that of the charging gate controlling bistable circuit 15. More specifically, the audio amplifier circuit 18 is made to operate in case the field intensity discriminating circuit 13 is in the high field intensity state or in case the charging gate controlling bistable circuit 15 is in such a state as to close the charging gate 7. These two states indicate that no frequency-sweeping operation is being performed. It is also possible to use an AND gate instead of the OR gate 7 to thereby bring the audio amplifier circuit 18 into the non-operative condition when the field intensity discriminating circuit 13 is in the low field intensity state to enable the charging gate controlling bistable circuit 15 to close the charging gate 7. This is because such state indicates that the sweeping operation is being performed. In fact, the circuit arrangement described above is easy to construct and capable of positively achieving various desired functions through the use of a small number of circuit elements, and thus such circuit arrangements can be advantageously utilized in radio receivers and other similar devices which are manufactured on a mass-production basis.

The reference numeral 14' represents a delay circuit which is provided for the purpose of setting the bistable circuit 15 in the same manner as the latter is set by the sweep start switch 16, after a predetermined period of time from the time when the field intensity discriminating circuit 13 is switched from the "set" state to the "reset" state. In case the initial state does not occur within a predetermined period of time from the time when the field intensity is decreased, the sweeping operation is again initiated by the output of the delay circuit 14'.

FIG. 2 shows a second embodiment of the present invention, which is similar to the arrangement of FIG. 1, except that a current flowing direction limiting element 19 such as diode or the like is used instead of the capacitor 14 of FIG. 1, an OR circuit 20 is provided for the purpose of imparting an "OR" output based on the output of the field intensity discriminating circuit 13 and that of the sweeping bistable circuit 15 to the charging gate 7 to control the latter, and the audio amplifier circuit 18 of the receiver is under the control of only the sweeping bistable circuit 15.

Description will now be made of the operation of the circuit arrangement of FIG. 2.

The general operation is similar to that of FIG. 1, and therefore explanation will be made of the OR gate 20, field intensity discriminating circuit 13, sweeping bistable circuit 15 and audio amplifier circuit 18.

When the sweeping bistable circuit 15 is set, the output thereof is imparted to the charging gate 7 through the OR circuit 20 to render the gate operative. Thus, the sweeping operation is initiated.

At this point, if the field intensity discriminating circuit 13 is set, then its output is supplied to the OR circuit 20 whereby the operation of the charging gate 7 is sustained and the sweeping bistable circuit 15 is reset. The output of the sweeping bistable circuit 15 is set to a predetermined state only during the sweeping operation, and it is reset upon cessation of the sweeping operation due to the completion of the tuning operation. Thereafter, the state of the output of the bistable circuit 15 becomes independent of variations in the received field, and therefore it is possible to prevent noise from being supplied to the audio amplifier circuit 18 during the sweeping operation by controlling the audio amplifier circuit 18 in accordance with the output of the bistable circuit 15. In this case, if the OR gate 20 is substituted by an AND gate, then design should be made such that the charging gate 7 is closed while the field intensity discriminating circuit 13 is being in the low field intensity state and the sweeping bistable circuit 15 is being in the reset state.

FIG. 3 is a third embodiment of this invention which is capable of bi-directional sweeping operation. The elements indicated by the reference numerals 1 to 11, 13, 14, 19 and 20 are similar to the elements 1 to 11, 13, 14, 19 and 20 of FIG. 2, and therefore description of those elements will be omitted. The reference numeral 21 represents a discharging direction sweep start switch, and 22 a discharging gate controlling circuit constituted by an unbalance type Schmitt circuit or the like to control the discharging gate 11. The discharging gate controlling circuit 22 is set to the operative state by the outputs of the the buffer amplifier 8 and discharging direction sweep start switch 21, and it is reset by the outputs of a sweeping bistable circuit 23 and charging direction sweep start switch 24.

The sweeping bistable circuit 23 is set to a particular state corresponding to the sweeping operation by means of the charging direction sweep start switch 24 or the discharging direction sweep start switch 21, and it is reset by the reversal output of the field intensity discriminating circuit 13 simultaneously when the tuned state is attained with a sufficient field after the sweeping operation. The reference numeral 25 indicates a current flowing direction limiting diode, and 26 a discharging resistor.

The operation of the foregoing arrangement will be described below. If the charging direction sweep start switch 24 is turned on during the closure of the discharging gate 11, then the sweeping bistable circuit 23 is set to open the charging gate 7 through the OR gate 20, and the charging control gate 3 is closed, with a result that there is established a charging loop including the power source, load resistor 4, integrating resistor 5, charging gate 7, capacitor 6 and ground, so that the capacitor 6 is charged. The voltage across the capacitor 6 is imparted to the buffer amplifier 8 so that a sweep voltage (or current) depending upon the voltage of the capacitor 6 is supplied to the variable reactance elements provided in the tuning circuit means 9. When a broadcast wave is received as a result of the sweeping operation, a strong input signal is supplied to the charging control gate 3 through the detector 2 so that the gate 3 is opened. Thus, there is established a loop including the power source, load resistor 4, charging control gate 3 and ground. At this point, the charging at the capacitor 6 is stopped. That is, the charging control gate 3 is opened or closed depending upon the intensity of an input field imparted to the charging control gate 3, so that the quantity of charge at the capacitor 6 is maintained at a predetermined value.

At this time, the field intensity discriminating circuit 13 is also reversed in operation due to the strong input field so that the sweeping bistable circuit 23 is reset thereby, while the charging gate 7 is kept in the open state by the output of the field intensity discriminating circuit 13. If, in this state, the input field is suddenly decreased due to fading or other causes, the input signal becomes substantially absent so that the charging control gate 3 is closed so that the capacitor 6 tends to be charged. However, such tendency that the capacitor 6 is charged is prevented by the fact that the field intensity discriminating circuit 13 is reset so that the charging gate 7 is closed by the action of the OR gate 20. Thus, the tuned state is maintained until the operation of the field intensity discriminating circuit 13 is reversed as a result of extinction of the fading state.

In an attempt to obtain a higher tuning point than the present one, the charging direction sweep start switch 24 is operated. In this case, the respective parts operate in the same manner as described above, and thus the desired tuning point is reached. When the voltage charged at the capacitor 6 reaches a predetermined value, the discharging gate controlling circuit 22 operates to open the discharging gate 11 so that the capacitor 6 is discharged until the quantity of charge thereat is decreased down to a predetermined value. The mode of operation described above is the forward sweeping operation. If the discharging direction sweep start switch 21 is rendered operative in the state that a certain tuning point is reached, the sweeping bistable circuit 23 is set so that the charging gate 7 is maintained in the open state and at the same time the discharging gate control circuit 22 is operated. Thus, the discharging gate 11 is opened, and the charge which has been accumulated at the capacitor 6 is discharged through a loop of the capacitor 6, discharging resistor 26 and discharging gate 11.

As a result, the tuning point is deviated, so that the field intensity discriminating circuit 13 is reset. If a new tuning point is reached during the above discharge so that a strong input field is applied to the field intensity discriminating circuit 13, the sweeping bistable circuit 23 is reset by the output of the field intensity discriminating circuit 13. Thus, the discharging gate controlling circuit 22 is returned to the original state by the resulting reset pulse to cause the discharging gate 11 to be returned to the original state. Consequently, a tuned state is attained. This means that a lower tuning point than the previous one is reached. By operating the discharging direction sweep start switch 21 again, a further lower tuning point can be reached in the same manner as described above.

In the foregoing, description has been made of the case where the discharge controlling circuit 22 is controlled by the output of the sweeping bistable circuit 23 or field intensity discriminating circuit 13. More generically, however, the discharge controlling circuit 22 may be reversed in operation by a signal which is available from a circuit such for example as the detector 2 or AGC detecting portion, which is adapted to provide a signal upon arrival of a received signal during the sweeping operation.

Furthermore, in the foregoing, description has been made of the case where the tuning control is effected with the aid of an arrangement wherein a charging circuit with a predetermined time constant is suitably discharged in a controlled manner by the use of a received signal so as to prevent the charging circuit from being charged to a greater quantity of charge than that corresponding to the tuned point, thus maintaining the tuned state. With an auomatic tuning type receiver wherein a discharging circuit is suitably charged in a controlled manner by the use of a signal obtained by detecting a received signal to prevent the discharging circuit from being discharged to a less quantity of charge than that corresponding to the tuned point so as to thereby maintain the tuned state, it is also possible that the tuning control is achieved only when the sweep is effected in one direction, as in the foregoing example. Thus, it is possible to easily construct an automatic tuning device adapted for bi-directional sweeping operation, by suitably selecting the time constant for sweep return and reversing the circuit condition in the sweeping direction upon arrival of a received signal.

Referring to FIG. 4, there is shown a fourth embodiment of the present invention, wherein the reference numeral 31 represents a tuning control signal generating circuit which may be constituted by a frequency discriminator or the like and which is adapted to detect tuning deviation occurring in the receiver circuit during the signal reception, and 32 a field intensity discriminating circuit which is so designed that a negative D.C. voltage with the necessary steepness of rise is produced from a signal obtained by suitably amplifying and detecting a received signal simultaneously when the receiver circuit enters into the tuned state, and that said D.C. voltage is extinguished upon occurrence of deviation from the tuned state. The reference numeral 33 indicates a discharging bistable circuit, 34 a charging bistable circuit, 35 a discharging direction sweep start switch, 36 a charging direction sweep start switch, 37 a buffer amplifier adapted to amplify, attenuate or convert into impedance or current the voltage across a capacitor 46 which determines a voltage or current to be supplied to variable reactance elements, 38 and 39 diodes for cutting off the circuit when a reverse bias is applied thereto, 40 and 41 resistors determining the time constants for the charge and discharge, and 42 a capacitor constituting a differentiating circuit together with a resistor 45 which also serves to discharge the charges stored between the capacitor 42 and the diodes 43 and 44. The diodes 43 and 44 are connected in such a polarity as to enable only that component of the output of the differentiating circuit which is of a predetermined polarity to be transmitted to the discharging bistable circuit 33 and the charging bistable circuit 34.

Description will now be made of the operation of this embodiment. If the charging bistable circuit 34 is set by means of the charging direction sweep start switch 36, then the capacitor 46 is charged through the resistor 41 and diode 39, while if the charging bistable circuit 34 is reversed by a reset signal, then the diode is biased in the reverse direction, so that the charging at the capacitor 46 is stopped. On the other hand, if the discharging bistable circuit 33 is set by means of the discharging direction sweep start switch 35, then the charge stored at the capacitor 46 is discharged through the diode 38 and resistor 40, while if the discharging bistable circuit 33 is reversed by a reset signal, then the diode 38 is biased in the reverse direction so that the discharge is stopped. The charging direction sweep start switch 36 is so connected as to set the charging bistable circuit 34 and at the same time reset the discharging bistable circuit 33, and the discharging direction sweep start switch 35 is so connected as to set the discharging bistable circuit 35 and at the same time reset the charging bistable circuit 34. Thus, there is no possibility that the charging bistable circuit 34 and the discharging bistable circuit 33 are simultaneously set, and therefore the sweeping never fails to be stably effected in one direction.

Furthermore, the sweeping operation can be reversed at any desired position by means of the sweep start switches 35 and 36. This can be freely done both in the tuned state and the sweeping state.

The connection is made such that the output of the field intensity discriminating circuit 32 is passed through the differentiating circuit constituted by the capactor 42 and resistor 45 so as to be converted to positive or negative-going pulses in accordance with increase or decrease thereof, and only one component of the differentiation output that goes in a predetermined one direction, e.g., only the negative-going pulses are supplied to the discharging bistable circuit 33 and the charging bistable circuit 34 through the diodes 43 and 44 so that these latter circuits are reset by the negative-going pulses, respectively.

Thus, it is possible that the sweeping operation is initiated when the discharging bistable circuit 33 or the charging bistable circuit 34 is set by the operation of the discharging direction sweep start switch 35 or the charging direction sweep start switch 36, and that when a strong input is imparted to the field intensity discriminating circuit 32 to reset the discharging bistable circuit 33 or the charging bistable circuit 34 through the differentiating circuit, the sweeping operation is stopped until the reset discharging direction sweep start switch 35 or the charging direction sweep start switch 36 is again actuated.

Under the condition where the sweep is stopped, the quantity of charge at the capacitor 46 is controlled only by the tuning control signal generating circuit 31, which detects a minute deviation of the received frequency to thereby control the voltage or current supplied to each variable reactance tuning element to such a value that optimum circuit constants can always be maintained. The tuning control signal generating circuit 31 serves to enable the receiver to be tuned to a particular transmission wave indicated by the cessation of the sweep under the optimum condition. Among the tuning methods are a method of effecting absorption control to seek the value corresponding to the maximum output of the received signal and a method of AFC controlling the signal with the intermediate frequency as the reference.

It is also possible that the application of the output of the tuning control signal generating circuit 31 to the capacitor 46 may be temporarily interrupted by means of a gate provided at the output side of the circuit 31. In such case, however, it is meaningless to increase the output of the tuning control signal generating circuit 31 to such an extent that the required sweep is prevented. No problem will arise when the sweep is to be effected, if the output of the tuning control signal generating circuit 31 is limited to a sufficient value to achieve tuning control when the sweep is ceased.

FIG. 5 illustrates an arrangement wherein the functions of the sweeping bistable circuits 33 and 34 of FIG. 4 can be produced by a single bistable circuit.

Referring to FIG. 5, the reference numeral 51 represents a capacitor. A voltage or current supplied to the variable reactance element of each tuning circuit is determined with the voltage across the capacitor 51 as the tuning reference voltage. The reference numeral 52 indicates a buffer circuit for supplying the voltage of the capacitor 51 to each variable reactance element in the form of current or voltage and which often includes an amplifier circuit, The reference numeral 53 denotes an automatic sweep reversing circuit which is a kind of bistable circuit constituted by an unbalance type Schmitt circuit and which is adapted to be automatically reversed when the voltage at the capacitor 51 reaches a predetermined positive or negative level during the sweeping operation and also optionally reversed between two states by means of a switch. The reference numeral 54 represents a resistor determining the time constant when the charge at the capacitor 51 is discharged for sweep in accordance with the output of the automatic sweep reversing circuit 53, and 55 a resistor determining the time constant when the capacitor 51 is charged for sweep.

The reference numerals 56, 57, 58 and 59 indicate diodes, the function of which will be described later, 60 a sweep switch comprising non-locking type push buttons A and B each having two short-circuiting contacts, and 61 a sweep change-over switch which is adapted to provide a different sweeping function according to whether contract *a* or *b* is closed.

The reference numeral 62 denotes a sweeping bistable circuit which is set by means of the sweep switch 60 and reset upon arrival of a received signal. The sweeping bistable circuit 62 controls a gate circuit constituted by the resistors 54 and 55 and diodes 56, 57, 58 and 59 and serves as a signal source utilized for achieving other various functions. The reference numeral 63 indicates a tuning detection signal generating circuit for generating a signal to reset the sweeping bistable circuit 62 when signal tuning is effected in the receiving circuit. The reference numeral 64 represents a resistor, and 65 a capacitor which is charged through the resistor 64 when the sweep switch 61 is positioned at the contact *b* side and discharged by the sweep switch 60. The reference numeral 66 denotes a tuning control signal generating circuit adapted to detect deviation of the tuning in the receiving circuit and produce a signal to correct such deviation.

The operation of this embodiment will be described below.

Assume that the sweep change-over switch 61 is positioned at the contact *b* side. Depression of the button A of the sweep switch 60 enables the automatic sweep reversing circuit 53 to produce an earth level output so that the capacitor 51 is discharged. At the same time, the sweeping bistable circuit 62 is set to the sweeping state.

The use of bistable multivibrator for the sweeping bistable circuit 62 results in two outputs A′ and B′ of different properties, and for the sweeping state, a combination of diodes 56, 57, 58 and 59 such as shown in FIG. 5 is conceivable, on the assumption that the output A′ is of the earth level and the output B′ is of the power source level. That is, in the sweeping state, the diodes 58 and 59 are provided with such voltages as to render them nonconductive, so that the sweeping control with respect to the capacitor 51 by the automatic sweep reversing circuit 63 is effected irrespective of the presence of the sweeping bistable circuit 62.

The discharge sweep of the capacitor 51 is effected through a path of the capacitor 51-diode 56-resistor 54-automatic sweep reversing circuit 53. The sweep velocity can be set to any desired value by selecting the values for the resistors 54 and 55.

If the receiving circuit is tuned to a signal by the sweeping operation, a reset signal is provided by the tuning detecting circuit 53 on the basis of the input signal from the receiving circuit, whereby the sweeping bistable circuit 52 is reversed so as to be returned to the non-sweeping state. At this time, the output A′ is of the power source level, and the output B′ is of the earth level.

In such state, the diodes 56 and 57 are rendered non-conductive, so that it is impossible that the output of the automatic sweep reversing circuit 53 has effect on the capacitor 51 both in respect of charge and discharge.

In the non-sweeping state, the voltage of the capacitor 51 is controlled by the output of the tuning control signal generating circuit 66 so that it is always corrected to prevent deviation of the tuning in the receiver circuit from occurring due to leakage of charges, variations of electric constants of the circuits, etc.

Depression of the button B of the sweep switch causes the automatic sweep reversing circuit 53 to be set to the opposite state to the case where the button A is depressed, and the receiving state is attained in the same manner as in the case where the button A is depressed, except that charging sweep control is effected with respect to the capacitor 51.

When the tuning constant of the variable reactance elements reach one limit of the reception range as the charging at the capacitor 51 proceeds, the automatic sweep reversing circuit 53 is reversed so that discharge is automatically effected through the buffer circuit 52, that is, the output thereof comes to be of the earth level.

On the other hand, when the tuning constant of the variable reactance elements reach the other limit of he reception range as the discharge of the capacitor 51 proceeds, the automatic sweep reversing circuit 53 is similarly reversed to the charging state, that is, the output thereof comes to be of the power source level so that the sweep continues.

In this way, the sweep continues until the receiver circuit is tuned to a signal, and once signal tuning has been achieved resulting in the cessation of the sweep, the sweep will never be performed unless the sweep switch 60 is depressed.

In the foregoing, the sweep switch 60 was released promptly after the depression. If the sweep switch 60 is maintained in the depressed state, however, in case the sweep change-over switch 61 is set to the contact *b* side, the sweep is not interrupted even when the receiver circuit is tuned to a signal. The sweep is ceased by a signal which is tuned first subsequent to the release of the sweep switch 60.

This is because the sweeping bistable circuit 62 cannot be reversed to the non-sweeping state even if a signal from the tuning detection signal generating circuit 63 is supplied thereto since the sweeping bistable circuit 62 is kept in the sweeping state with the sweep switch 60 being maintained in the depressed state. Thus, a desired frequency can be tuned by suddenly releasing the sweep switch 60 which has been depressed immediately before the point corresponding to the desired frequency.

In an attempt to tune the receiver to a frequency which is immediately adjacent to the presently tuned signal or avoid such troublesome operation as to release the sweep switch 60 promptly after the depression, it is desired that the sweep be stopped by a signal which is tuned first subsequent to the initiation of the sweep, irrespective of the period of time for which the sweep switch 60 is depressed.

In such cases, the sweep change-over switch 61 should be positioned at the contact *a* side. Thus, the capacitor 65 is charged with a voltage of the power source level through the resistor 64 while the push button 60 is not depressed. At this point, if the sweep switch 60 is depressed, the capacitor 65 is grounded through the sweep switch. Such short-circuiting results in a sharp impulse, which is in turn supplied to the sweeping bistable circuit 62 through the capacitor 65 to set the sweeping bistable circuit 62 to the sweeping state. Thereafter, the sweeping bistable circuit 62 becomes operationally irrelative with respect to the sweep switch 60, whether the latter is depressed or not, since the sweeping bistable circuit 62 is d.c.-wise separated from the sweep switch 60. The sweep is stopped by a signal from the tuning detection signal generating circuit 63.

In case it is desired that the sweep be again effected, it is required that the push button of the sweep switch 60 be once released and again depressed.

It is necessary to use a sufficiently great value for the resistor 64, since if the latter is of too small a value, the sweeping bistable circuit 62 is adversely affected when the sweep change-over switch 61 is set to the contact *b* side. When the push button of the sweep switch 60 is released, the capacitor 65 is charged with a time constant defined by the capacitor 65 and resistor 64. At this point, therefore, there is no possibility that the sweeping bistable circuit is reversed.

The output of the sweeping bistable circuit 62 is important to distinguish between the sweeping state and non-sweeping state. More specifically, the output of the sweeping bistable circuit 62 can be used not only to control the gate circuit for the sweep control provided by the automatic sweep reversing circuit 63 but also to control sound output during the sweeping operation, control the input sensitivity, or control the tuning control circuit 66 in some cases.

As described above, the receiver according to the present invention, the frequency sweep and the sustention of a tuned state can be positively achieved.

What is claimed is:

1. An automatic tuning receiver comprising, in combination, a radio-frequency circuit section having variable reactance tuning elements; a local oscillator circuit having variable reactance tuning elements; a mixer circuit to which the outputs of said radio-frequency circuit section and said local oscillator section are connected; and intermediate-frequency circuit section; an audio-frequency circuit section; a charging-discharging circuit to which said radio-frequency circuit section and local oscillator circuit are electrically connected; said charging-discharging circuit including capacitive means controlling the reactance of said variable reactance elements, switching means connected with said intermediate-frequency circuit section and controlled by the output thereof, gate means connected between said switching means and said capacitive means, and gate control circuit means closing said gate when the intensity of an electro-magnetic wave to which the receiver is being tuned is substantially reduced below normal operating intensity; and a buffer amplifier having a high input impedence connected between said capacitive means and variable reactance elements to convert the terminal voltage of said capacitive means into a tuning signal and to apply the latter to said variable reactance elements, whereby the receiver is automatically tuned to a desired electro-magnetic wave and is maintained in a tuned state even when the field intensity of said electro-magnetic wave is substantially lowered.

2. An automatic tuning receiver as defined in claim 1, further comprising narrow bandpass amplifier means to amplify a portion of the output of said intermediate frequency circuit section and means to detect said amplified output portion, the output of said detector means being supplied to said switching means and to said gate control circuit means; said charging-discharging circuit further including a discharging circuit path through which said capacitive mean is, as soon as it is charged to a maximum voltage, discharged to return directly to a minimum voltage, said circuit path being in parallel with said capacitive means.

3. An automatic tuning receiver as defined in claim 1, further comprising narrow bandpass amplifier means to amplify a first portion of the output of said intermediate frequency circuit section and first means to detect said first amplified output portion, the output of said first detector means being supplied to said switching means, second means to detect and integrate a second portion of the output of said intermediate frequency circuit section, the output of said second detector and integrator means being supplied to said gate control circuit means; said charging-discharging circuit further including a discharging circuit path through which said capacitive means is, as soon as it is charged to a maximum voltage, discharged to return directly to a minimum voltage, said circuit path being in parallel with said capacitive means.

4. An automatic tuning receiver as defined in claim 1, further comprising narrow bandpass amplifier means to amplify a first portion of the output of said intermediate frequency circuit section and first means to detect said first amplified output portion, the output of said first detector means being supplied to said switching means, second means to detect and integrate a second portion of the output of said intermediate frequency circuit section, the output of said second detector and integrator means being supplied to said gate control circuit means; said charging-discharging circuit further including a discharging circuit path through which said capacitive means is discharged at a speed comparable to that at which said capacitive means is charged, and means to stop said discharging using a portion of the output of said narrow bandpass amplifier.

5. An automatic tuning receiver as defined in claim 1, wherein said charging-discharging circuit further comprises a sweeping bistable circuit set by one of a charging direction sweep start switch and a discharging direction sweep start switch and reset by a signal obtained from means amplifying a portion of the output of said intermediate frequency circuit section at a narrow bandpass amplifier; an automatic sweep reversing circuit having two potential states, the potential state of said automatic sweep reversing circuit being reversible by one of a maximum and a minimum of the output of said buffer amplifier and the outputs of said sweep start switches; and sweep gate means connected between said capacitive means and said automatic sweep reversing circuit; said sweep gate means being controlled by said sweeping bistable circuit; and further comprising narrow bandpass amplifier means to amplify a portion of the output of said IF circuit section; means to detect said amplified output portion, the output of said detector means being supplied to said switching means and further means to detect and integrate another portion of the output of said intermediate frequency circuit section, the said output of said further detector and integrator means being supplied to said gate control circuit means.

6. An automatic tuning receiver as defined in claim 5, further comprising means to frequency discriminate a portion of the output of said intermediate-frequency circuit section, the output of said frequency discriminator means being fed to said switching means to thereby control the latter.

7. An automatic tuning receiver as defined in claim 6, further comprising circuit means for supplying an impulse signal to said sweeping bistable circuit to cause the latter to begin a sweeping operation upon actuation of said automatic sweep reversing circuit.

References Cited

UNITED STATES PATENTS

| | | | |
|---|---|---|---|
| 3,189,829 | 6/1965 | Bento et al. | 325—470 |
| 3,467,868 | 9/1969 | Buhr | 325—456 |
| 3,467,870 | 9/1969 | Aoyama | 325—470 |
| 3,447,087 | 5/1969 | Takezaki et al. | 325—422 |

ROBERT L. GRIFFIN, Primary Examiner

B. V. SAFOUREK, Assistant Examiner

U.S. Cl. X.R.

325—464